(12) United States Patent
Yamauchi

(10) Patent No.: US 8,107,251 B2
(45) Date of Patent: Jan. 31, 2012

(54) ELECTRONIC DEVICE

(75) Inventor: Satoshi Yamauchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 460 days.

(21) Appl. No.: 12/320,155

(22) Filed: Jan. 21, 2009

(65) Prior Publication Data

US 2009/0237896 A1    Sep. 24, 2009

(30) Foreign Application Priority Data

Mar. 19, 2008   (JP) .................................. 2008-72335

(51) Int. Cl.
*H05K 5/00* (2006.01)
(52) U.S. Cl. ........ 361/752; 361/730; 439/587; 174/52.4
(58) Field of Classification Search .................. 361/730, 361/752, 796, 800, 816, 818; 439/587, 589; 174/52.4, 52.3
See application file for complete search history.

(56) References Cited

U.S. PATENT DOCUMENTS

| | | | |
|---|---|---|---|
| 6,146,198 A | 11/2000 | Maeda | |
| 6,343,953 B2 | 2/2002 | Nakamura et al. | |
| 6,407,925 B1 | 6/2002 | Kobayashi et al. | |
| 6,707,678 B2 | 3/2004 | Kobayashi et al. | |
| 7,144,275 B2 | 12/2006 | Iida | |
| 7,514,784 B2 * | 4/2009 | Mayuzumi et al. | 257/712 |
| 2007/0134981 A1 | 6/2007 | Shinoda et al. | |

* cited by examiner

*Primary Examiner* — Jinhee Lee
*Assistant Examiner* — Ingrid Wright
(74) *Attorney, Agent, or Firm* — Posz Law Group, PLC

(57) ABSTRACT

An electronic device includes a wiring board, a connector, a case, and a sealing member. The connector includes a housing and a plurality of terminals held by the housing and arranged in a longitudinal direction of the housing. The case has an opening for exposing a part of the connector. An inner space of the case is a waterproof space due to the sealing member. The sealing member includes a parallel part approximately parallel to a surface of the wiring board and an inclined part extending in a direction approximately perpendicular to the longitudinal direction of the housing of the connector.

8 Claims, 9 Drawing Sheets

ELECTRONIC DEVICE

CROSS REFERENCE TO RELATED APPLICATION

This application is based on Japanese Patent Application No. 2008-72335 filed on Mar. 19, 2008, the disclosure of which is incorporated herein by reference in its entirety.

BACKGROUND OF THE INVENTION

1. Field of the Invention

The present invention relates to an electronic device having a waterproof space.

2. Description of Related Art

JP-A-2001-85858 (corresponding to U.S. Pat. No. 6,407,925 and U.S. Pat. No. 6,707,678) or JP-A-2006-100252 (corresponding to U.S. Pat. No. 7,144,275) discloses an electronic device having a case constructed with a first casing and a second casing. The case accommodates a wiring board having a connector. The first casing and the second casing are assembled in a thickness direction of the wiring board. An inner space constructed with the first casing and the second casing is a waterproof space due to a sealing member.

One of the first and second casings corresponds to a main casing having a communication port for the connector on a side wall. A terminal of the connector to be connected to an external connector is exposed from the communication port in a state that the first casing and the second casing are assembled. The sealing member includes a first sealing disposed between the first casing and the second casing, and a second sealing disposed between the main casing and a housing of the connector. The second sealing has a parallel part, which is parallel to a surface of the wiring board and separated from the first sealing in a thickness direction of the wiring board, and an inclined part connecting the parallel part and the first sealing. Because the inclined part connecting the parallel part and the first sealing has an inclined structure, the sealing member can be prevented from being broken when the first casing and the second casing are assembled.

However, the inclined part and the parallel part are arranged on the same line along a longitudinal direction of the housing of the connector. That is, the parallel part is located between the inclined parts in the longitudinal direction of the housing of the connector. Thus, a size of the electronic device becomes large in the longitudinal direction of the housing of the connector, compared with an electronic device not having the inclined part of the second sealing.

SUMMARY OF THE INVENTION

In view of the foregoing and other problems, it is an object of the present invention to provide an electronic device.

According to a first example of the present invention, an electronic device includes a wiring board, a connector, a case, and a sealing member. The wiring board has electronic parts thereon. The connector corresponds to the electronic parts and includes a housing made of an insulation material, and a plurality of terminals for electrically connecting the wiring board and an external connector. The plurality of terminals is held by the housing and arranged in a longitudinal direction of the housing. The case has an inner space constructed with a first casing located to oppose the connector, and a second casing mounted to the first casing in a thickness direction of the wiring board. The case has an opening for exposing a part of the connector and accommodates other part of the connector and the wiring board in the inner space. The sealing member includes a first sealing, a second sealing, and a third sealing. The first sealing is disposed between a periphery of the first casing and a periphery of the second casing. The second sealing is disposed between a periphery of the first casing and the housing of the connector. The third sealing is disposed between a periphery of the second casing and the housing of the connector. The first sealing, the second sealing, and the third sealing are connected to each other such that the inner space of the case is a waterproof space. At least one of the second sealing and the third sealing includes a parallel part and an inclined part. The parallel part is approximately parallel to a surface of the wiring board, and is separated from the first sealing in a thickness direction of the wiring board. The inclined part connects the parallel part and the first sealing, and has a first end connected to the first sealing and a second end connected to the parallel part. The inclined part extends from the second end to the first end in a direction approximately perpendicular to the longitudinal direction of the housing of the connector.

According to a second example of the present invention, an electronic device includes a wiring board, a connector, a case, and a sealing member. The wiring board has electronic parts thereon. The connector corresponds to the electronic parts and includes a housing made of an insulation material, and a plurality of terminals for electrically connecting the wiring board and an external connector. The plurality of terminals is held by the housing and arranged in a longitudinal direction of the housing. The case has an inner space constructed with a first casing located to oppose the connector, and a second casing mounted to the first casing in a thickness direction of the wiring board. The case has an opening for exposing a part of the connector and accommodates other part of the connector and the wiring board in the inner space. The sealing member includes a first sealing, a second sealing, and a third sealing. The first sealing is disposed between a periphery of the first casing and a periphery of the second casing. The second sealing is disposed between a periphery of the first casing and the housing of the connector. The third sealing is disposed between a periphery of the second casing and the housing of the connector. The first sealing, the second sealing, and the third sealing are connected to each other such that the inner space of the case is a waterproof space. At least one of the second sealing and the third sealing includes a parallel part and an inclined part. The parallel part is approximately parallel to a surface of the wiring board, and is separated from the first sealing in a thickness direction of the wiring board. The inclined part connects the parallel part and the first sealing. The parallel part and the inclined part have an angle equal to or larger than 90° and smaller than 180° between the parallel part and the inclined part.

According to a third example of the present invention, an electronic device includes a wiring board, a connector, a case, and a sealing member. The wiring board has electronic parts thereon. The connector corresponds to the electronic parts and includes a housing made of an insulation material, and a plurality of terminals for electrically connecting the wiring board and an external connector. The plurality of terminals is held by the housing and arranged in a longitudinal direction of the housing. The case has an inner space constructed with a first casing located to oppose the connector, and a second casing mounted to the first casing in a thickness direction of the wiring board. The case has an opening for exposing a part of the connector and accommodates other part of the connector and the wiring board in the inner space. The sealing member seals the opening of the case such that the inner space of the case is a waterproof space. The opening of the case has an inclined part inclined in a minor direction of the housing of the connector.

Accordingly, the sealing member can be prevented from being broken, and a size of the electronic device can be smaller in the longitudinal direction of the housing of the connector.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT

First Embodiment

For example, an electronic device having a waterproof construction is an electronic control unit 100 for controlling an engine of a vehicle. The electronic control unit 100 is disposed outside of a vehicle compartment, for example, in an engine compartment.

Figure 1:
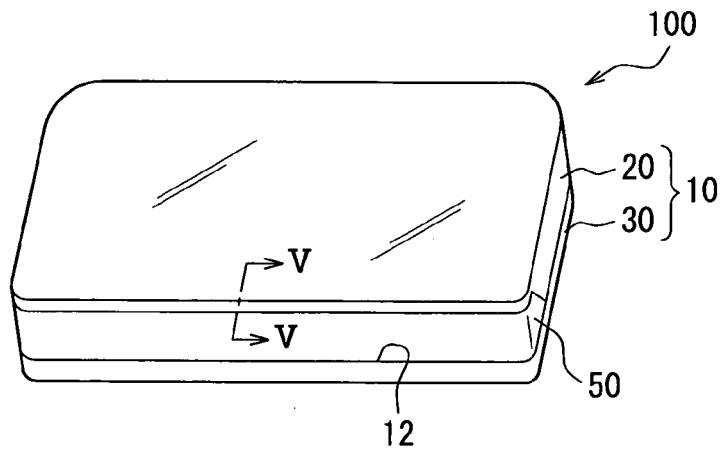
FIG. 1 is a schematic perspective view showing a construction of an electronic control unit according to a first embodiment.
Figure 2:
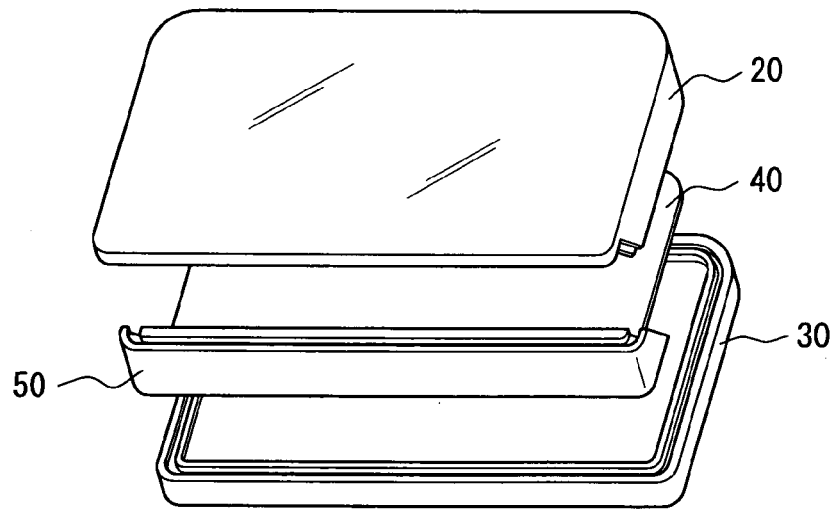
FIG. 2 is a schematic exploded perspective view showing the electronic control unit.
Figure 3:
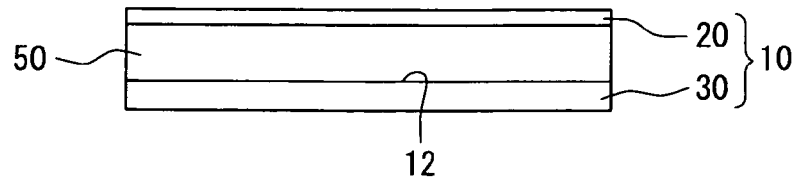
FIG. 3 is a schematic elevation view of FIG. 1.
Figure 4:
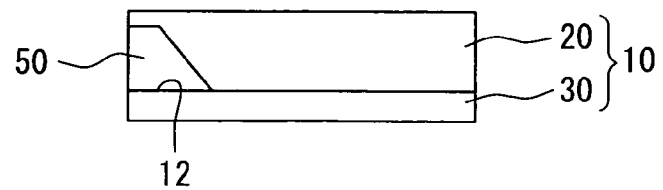
FIG. 4 is a schematic side view of FIG. 1.
Figure 5:
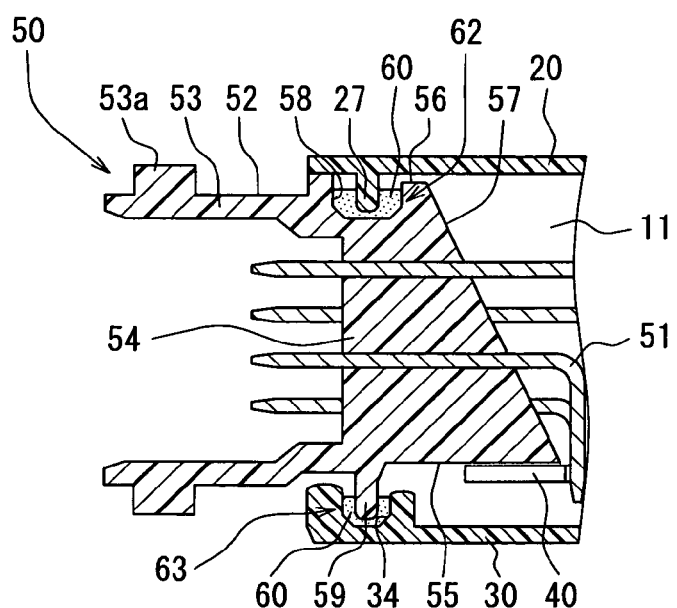
FIG. 5 is a cross-sectional view taken along line V-V of FIG. 1.

FIG. 1 is a perspective view showing a construction of the electronic control unit 100. FIG. 2 is an exploded perspective view showing the electronic control unit 100 before assembled. FIG. 3 is an elevation view of the electronic control unit 100 of FIG. 1, which is seen from a face to which an external connector is to be mounted. FIG. 4 is a side view of the electronic control unit 100, which is seen from a right side of FIG. 1. FIG. 5 is a cross-sectional view taken along line V-V of FIG. 1.

Figure 6:
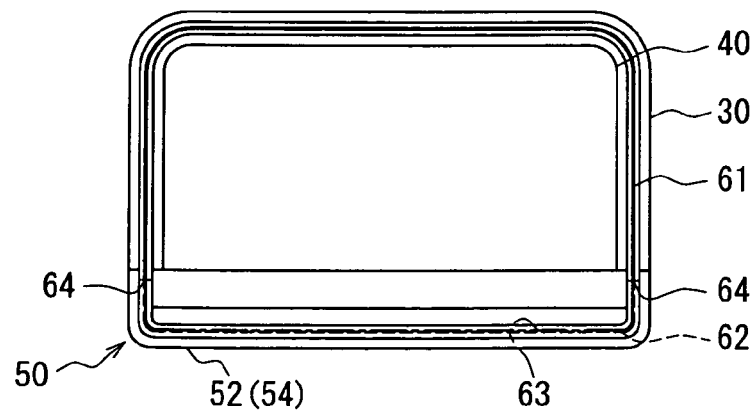
FIG. 6 is a schematic plan view showing a sealing member of the electronic control unit.
Figure 7:
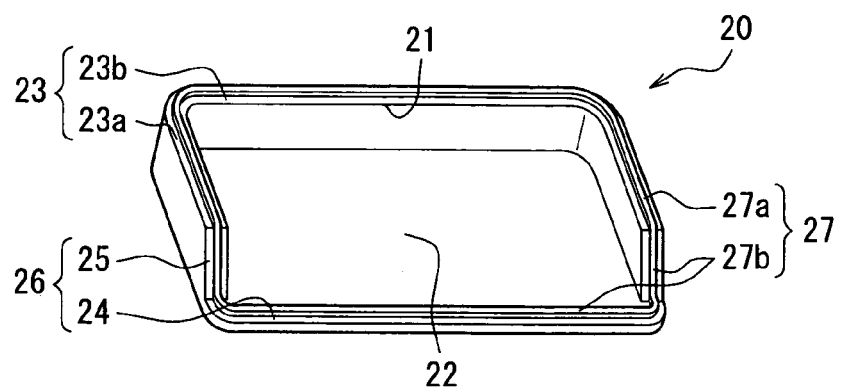
FIG. 7 is a perspective view showing a first casing of the electronic control unit.
Figure 8:
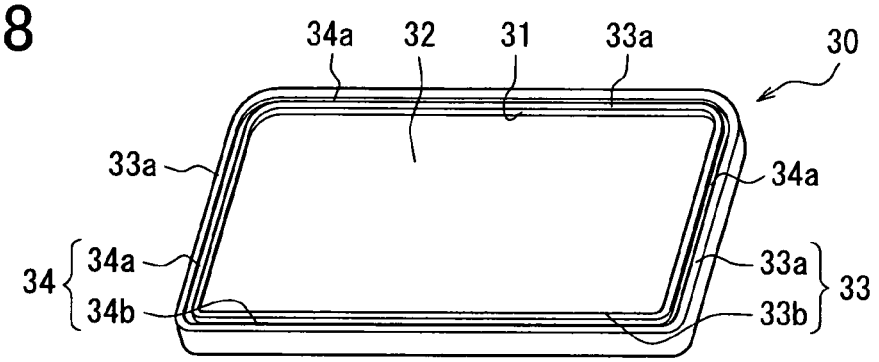
FIG. 8 is a perspective view showing a second casing of the electronic control unit.
Figure 9:
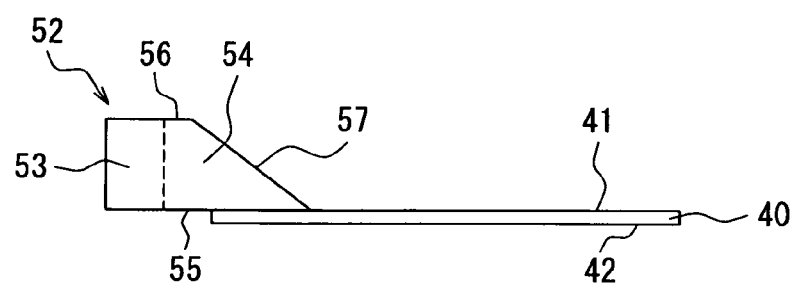
FIG. 9 is a schematic side view showing a wiring board and a connector of the electronic control unit.
Figure 10:
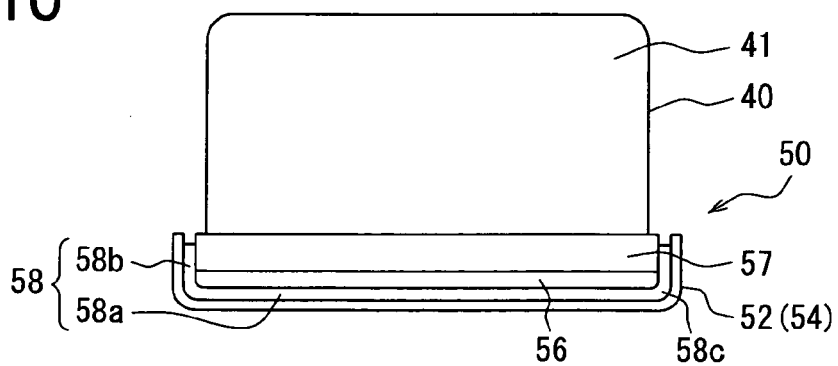
FIG. 10 is a plan view of FIG. 9.

FIG. 6 is a schematic plan view showing a sealing member 60 of the electronic control unit 100. FIG. 7 is a perspective view showing a first casing 20 of the electronic control unit 100, which is seen from an inner side of the first casing 20. FIG. 8 is a perspective view showing a second casing 30 of the electronic control unit 100, which is seen from an inner side of the second casing 30. FIG. 9 is a side view showing a wiring board 40 and a connector 50 of the electronic control unit 100, which is seen from a longitudinal end side of the wiring board 40. FIG. 10 is a plan view of the wiring board 40 and the connector 50 of FIG. 9, which is seen from a face to which the connector 50 is mounted.

Figure 11:
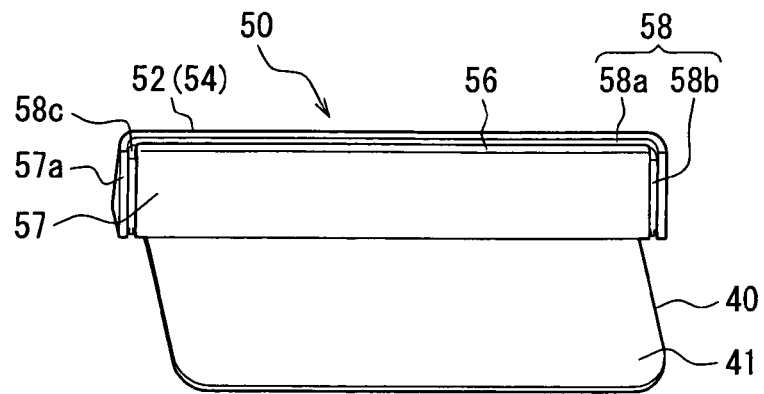
FIG. 11 is a perspective view of FIG. 9.
Figure 12:
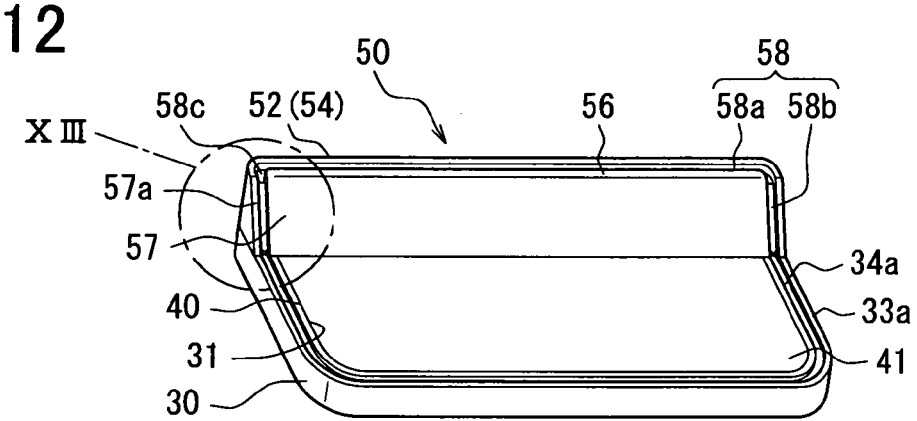
FIG. 12 is a perspective view showing a position relationship between the wiring board having the connector and the second casing.
Figure 13:
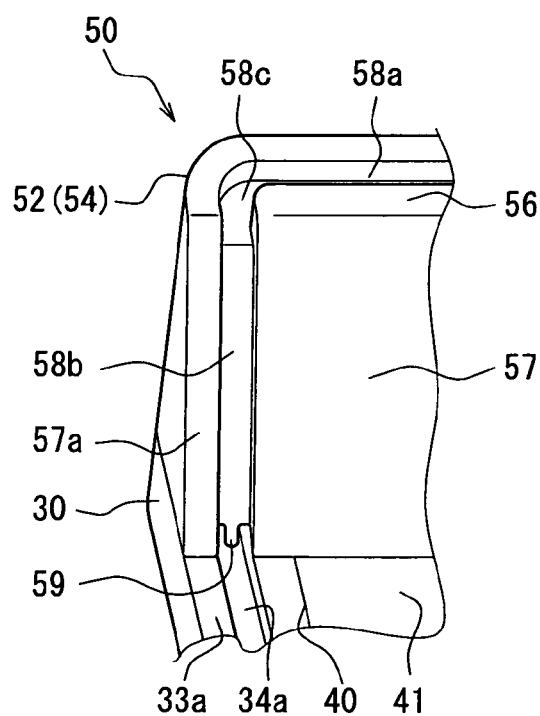
FIG. 13 is an enlarged view of FIG. 12.
Figure 14:
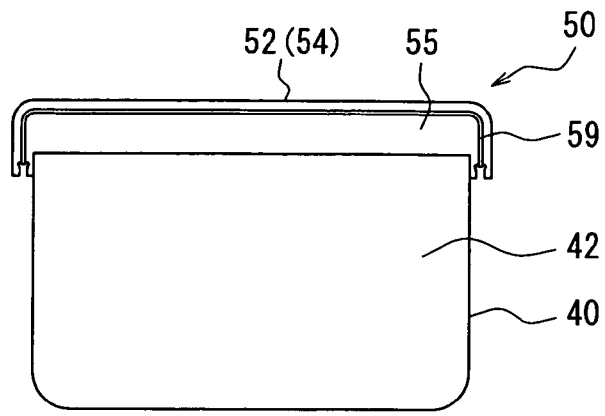
FIG. 14 is a bottom view of FIG. 9.
Figure 15:
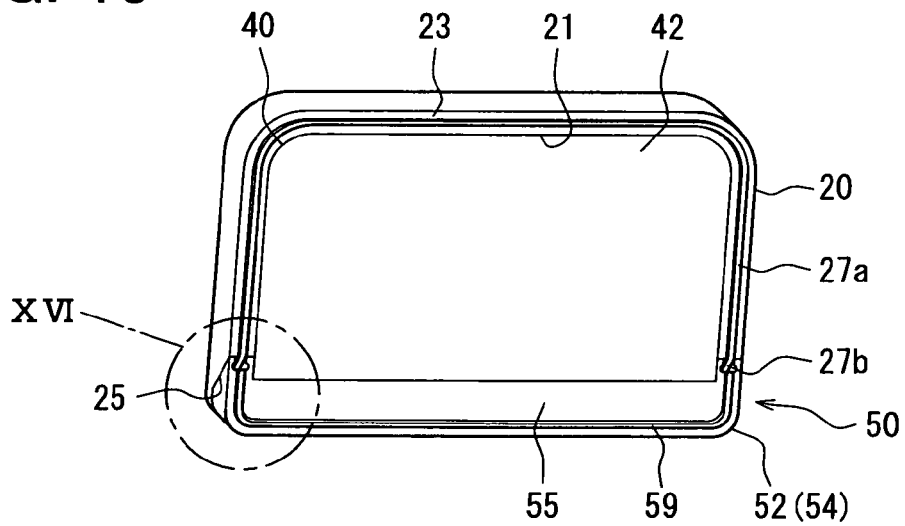
FIG. 15 is a perspective view showing a position relationship between the wiring board having the connector and the first casing.
Figure 16:
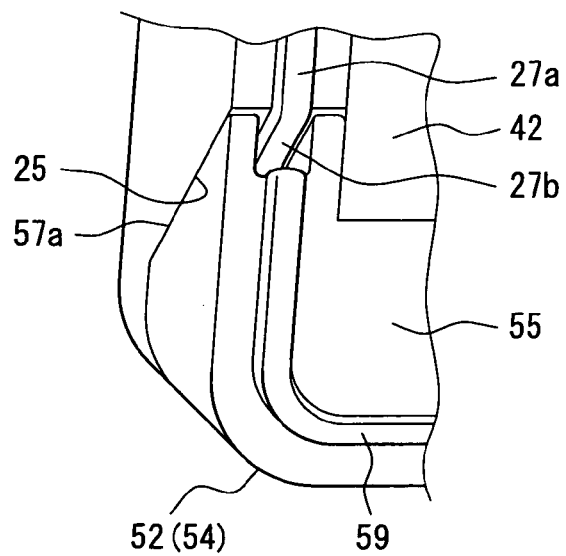
FIG. 16 is an enlarged view of FIG. 15.

FIG. 11 is a perspective view of the wiring board 40 and the connector 50 of FIG. 9. FIG. 12 is a perspective view showing a position relationship between the wiring board 40 and the second casing 30 when the wiring board 40 and the second casing 30 are assembled. FIG. 13 is an enlarged view of a longitudinal end of a housing 52 of the connector 50 of FIG. 12. FIG. 14 is a bottom view of the wiring board 40 and the connector 50 of FIG. 9. FIG. 15 is a perspective view showing a position relationship between the wiring board 40 and the first casing 20 when the wiring board 40 and the first casing 20 are assembled. FIG. 16 is an enlarged view of a longitudinal end of the housing 52 of the connector 50 of FIG. 15.

A left side from a dashed line of FIG. 9 corresponds to a fitting 53 of the connector 50, and a right side from the dashed line of FIG. 9 corresponds to a main body 54 of the connector 50. A terminal 51 of the connector 50 is omitted in FIGS.1-16 except for FIG. 5. The first casing 20 is omitted in FIG. 6.

A longitudinal direction is defined by a longitudinal direction of the housing 52 of the connector 50 along a surface of the wiring board 40. A minor direction is defined by a direction approximately perpendicular to the longitudinal direction of the housing 52 of the connector 50 along the surface of the wiring board 40. The minor direction corresponds to a minor direction of the housing 52 of the connector 50. The minor direction corresponds to a depth direction from an opening edge 26 of the first casing 20 toward an inner space 11 of a case 10 constructed with the first casing 20 and the second casing 30. A perpendicular direction is defined by a direction approximately perpendicular to the surface of the wiring board 40.

As shown in FIGS. 1 to 5, the electronic control unit 100 includes the case 10, the wiring board 40, the connector 50 and the sealing member 60. The wiring board 40 is disposed in the case 10. The connector 50 is one of the electronic parts mounted on the wiring board 40, and a part of the connector 50 is exposed from the case 10. The inner space 11 of the case 10 is a waterproof space due to the sealing member 60.

The case 10 is constructed with the first casing 20 and the second casing 30, which are assembled in a thickness direction of the wiring board 40, as shown in FIGS. 1 and 2. The first casing 20 is disposed at a main side of the wiring board 40, on which the connector 50 is mounted, and the second casing 30 is disposed at a back side of the wiring board 40.

The sealing member 60 is arranged on a first sealing 61 corresponding to a solid line of FIG. 6, a second sealing 62 corresponding to a dashed line of FIG. 6, and a third sealing 63 corresponding to a chain line of FIG. 6. Each of the sealings 61, 62, 63 has an approximately U-shape. The first sealing 61 is disposed between a periphery of the first casing 20 and a periphery of the second casing 30.

The second sealing 62 is disposed between a periphery of the first casing 20 and the housing 52 of the connector 50. The third sealing 63 is disposed between a periphery of the second casing 30 and the housing 52 of the connector 50. The second sealing 62 and the third sealing 63 are overlapped with each other through a main body 54 of the connector 50, as shown in FIG. 5. As shown in FIG. 6, two ends of the U-shape of the sealings 61, 62, 63 are connected to each other at a connection part 64 having a trifurcate structure. Thereby, the inner space 11 of the case 10 can be a waterproof space.

As shown in FIG. 7, the first casing 20 has a box shape with an opening 21 open toward the second casing 30. For example, the first casing 20 is manufactured by using an aluminum die-cast, a press work, or a resin molding. The first casing 20 is constructed with a bottom part 22, a wall part 23, a flat part 24, and an inclined part 25.

The bottom part 22 has an approximately rectangular shape, which corresponds to an outer shape of the wiring board 40. The wall part 23 has an approximately U-shape, and arranged on a periphery of an inner surface of the bottom part 22. The wall part 23 except for a predetermined area corresponding to the inclined part 25 has a predetermined height, and is approximately perpendicular to the inner surface of the bottom part 22. An upper face of the wall part 23 is approximately parallel to the inner surface of the bottom part 22, and opposes to the second casing 30. The first sealing 61 is disposed between the upper face of the wall part 23 and the second casing 30.

The flat part 24 is a periphery of the bottom part 22 except for the U-shape of the wall part 23, and is the same plane as the inner surface of the bottom part 22. The inclined part 25 corresponds to a predetermined area of two ends of the U-shape of the wall part 23, which are adjacent to the flat part 24. The inclined part 25 connects the wall part 23 and the flat part 24, and a height of the inclined part 25 becomes higher from the flat part 24 toward the wall part 23.

The wall part 23 is constructed with two parallel parts 23a and a connection part 23b connecting the two parallel parts 23a. The inclined part 25 continues to the parallel part 23a of the wall part 23 in a line. That is, the inclined part 25 is inclined in a minor direction of the housing 52 of the connector 50. The inclined part 25 extends in a direction approximately perpendicular to a longitudinal direction of the housing 52 of the connector 50.

Thus, the first casing 20 has a dustpan shape, such that a face opposing to the bottom part 22 and a part of the side face are open. Therefore, the periphery of the first casing 20 is defined by the wall part 23 and the opening edge 26 to be used for the connector 50. The opening edge 26 is constructed with the flat part 24 and the inclined part 25.

A projection 27 is located on the periphery of the bottom part 22, that is the wall part 23 and the opening edge 26, so as to be contact with the sealing member 60 enclosing the opening 21. The projection 27 has a ring shape, and is constructed with a case projection 27a corresponding to the second casing 20 and a connector projection 27b corresponding to the connector 50. The case projection 27a corresponds to a recess 34 of the second casing 30, which is to be described below.

The first sealing 61 is disposed between the case projection 27a and the recess 34. The case projection 27a has an approximately U-shape, and two corners of the U-shape are rounded. Specifically, the case projection 27a having a predetermined thickness protrudes from the upper face of the wall part 23, and extends from an end of the U-shape to the other end of the U-shape.

The connector projection 27b corresponds to a recess 58 of the housing 52 of the connector 50, which is to be described below. The second sealing 62 is disposed between the connector projection 27b and the recess 58. The connector projection 27b has an approximately U-shape, and two corners of the U-shape are rounded.

Specifically, the connector projection 27b having a predetermined thickness protrudes from an upper face of the opening edge 26, and extends from an end of the U-shape to the other end of the U-shape. Further, the two rounded corners are located on the flat part 24. The projection 27 having a ring shape is defined by connecting the case projection 27a and the connector projection 27b.

As shown in FIG. 8, the second casing 30 has a shallow box shape with an opening 31 open toward the first casing 20. For example, the second casing 30 is manufactured by using an aluminum die-cast, a press work, or a resin molding.

The second casing 30 is constructed with a bottom part 32, a wall part 33, and the recess 34. The bottom part 32 has an approximately rectangular shape, which corresponds to an outer shape of the wiring board 40. The wall part 33 is arranged on a periphery of an inner surface of the bottom part 32 so as to close the opening 31, and has a predetermined height in a direction approximately perpendicular to the inner surface of the bottom part 22.

The wall part 33 includes a case wall 33a opposing to the wall part 23 of the first casing 20, and a connector wall 33b opposing to the housing 52 of the connector 50. Each of the case wall 33a and the connector wall 33b has an approximately U-shape.

The connector wall 33b is an opening edge of the second casing 30, which is open for the connector 50, and corresponds to the opening edge 26 of the first casing 20. The connector wall 33b and the opening edge 26 are connected to each other so as to define an opening 12 of the case 10, when the first casing 20 and the second casing 30 are assembled. The opening 12 of the case 10 is defined to expose a connection part between the connector 50 and an external connector, as shown in FIGS. 1, 3 and 4.

The recess 34 is located on the periphery of the bottom part 32 of the second casing 30 so as to be contact with the sealing member 60 enclosing the opening 31. The recess 34 has a ring shape, and is constructed with a case recess 34a corresponding to the first casing 20 and a connector recess 34b corresponding to the connector 50.

The case recess 34a corresponds to the case projection 27a of the first casing 20 such that the first sealing 61 is disposed between the case projection 27a and the case recess 34a. The case recess 34a has an approximately U-shape, and two corners of the U-shape are rounded. Specifically, the case recess 34a having a predetermined width is recessed from the upper face of the wall part 33, and extends from an end of the U-shape to the other end of the U-shape.

As shown in FIG. 5, the recess 34 corresponds to a projection 59 of the housing 52 of the connector 50. The third sealing 63 is disposed between the recess 34 and the projection 59. The connector recess 34b of the recess 34 has an approximately U-shape, and two corners of the U-shape are rounded. Specifically, the connector recess 34b having a predetermined width is recessed from the upper face of the connector wall 33b, and extends from an end of the U-shape to the other end of the U-shape. The recess 34 having a ring shape is defined by connecting the case recess 34a and the connector recess 34b.

The wiring board 40 has electronic parts thereon. For example, the wiring board 40 has wirings including a land as an electrode, via holes connecting the wirings, a microcomputer, a power transistor, a resister, a capacitor and so on (not shown). The wiring board 40 has a rectangular shape, for example. The connector 50 for electrically connecting the wiring board 40 and outside is one of the electronic parts, and is mounted on the wiring board 40. The wiring board 40 is made of thermoplastic resin, thermosetting resin, ceramic, or a complex of resin and glass such as glass cloth, for example. The number of layers included in the wiring board 40 is not limited.

As shown in FIG. 5, the connector 50 has the terminals 51 and the housing 52. The terminals 51 electrically connect the wiring board 40 and an external connector (not shown). A part of the terminal 51 is held by the housing 52 made of an electrical insulating material such as resin. The terminals 51 made of a conductive material are arranged in a longitudinal direction of the housing 52. An end of the terminal 51 extending from the housing 52 is connected to the land (not shown) of the wiring board 40 through a solder. The other end of the terminal 51 is exposed from the case 10 so as to be electrically connected to the external connector.

Thus, the terminal 51 electrically connects the wiring board 40 and the external connector. A size of the terminal 51, the number of the terminals 51 and the number of columns of the terminals 51 in a direction perpendicular to the housing 52 are not limited. The terminal 51 is inserted into the wiring board 40, as shown in FIG. 5. However, a structure relationship between the terminal 51 and the wiring board 40 is not limited.

The housing 52 is constructed with the fitting 53 and the main body 54, as shown in FIG. 5. The fitting 53 is exposed from the case 10, and is fitted to the external connector. The main body 54 is disposed in the inner space 11 of the case 10. The second sealing 62 is disposed between the first casing 20 and the main body 54, and the third sealing 63 is disposed between the second casing 30 and the main body 54.

An end of the fitting 53 is connected to the main body 54, and the other end of the fitting 53 has a tube shape open for being connected to the external connector. That is, the fitting 53 is an external connection port. As shown in FIG. 5, the end of the terminal 51 is exposed in the external connection port so as to be connectable to the external connector. Further, a fitting projection 53a is arranged on an outer surface of the fitting 53 so as to be fitted to the external connector.

As shown in FIG. 9, the main body 54 holding the terminals 51 has a bottom face 55 and a top face 56. The bottom face 55 has a rectangular shape, and a part of the bottom face 55 is disposed on a top face 41 of the wiring board 40. The top face 56 overlaps with the bottom face 55 in a longitudinal direction of the housing 52 of the connector 50. The top face 56 overlaps with a part of the bottom face 55 in a minor direction of the housing 52 of the connector 50. An area of the top face 56 is smaller than an area of the bottom face 55. The top face 56 opposes to the flat part 24 of the first casing 20.

A front face 57 of the main body 54 connects the top face 56 and the bottom face 55, which are approximately parallel to each other. The front face 57 opposes to the inner space 11 of the case 10 in the minor direction of the housing 52 of the connector 50, and has a taper shape. A height of the front face 57 from the top face 41 of the wiring board 40 becomes higher from the bottom face 55 to the top face 56. FIG. 11 shows a longitudinal end 57a of the front face 57, which opposes to the inclined part 25 of the first casing 20.

The recess 58 corresponding to the connector projection 27b of the first casing 20 is arranged on the top face 56 and the longitudinal end 57a of the front face 57. The second sealing 62 is disposed between the connector projection 27b and the recess 58. The recess 58 is constructed with a top recess 58a of the top face 56, a front recess 58b of the longitudinal end 57a of the front face 57, and a corner recess 58c connecting the top recess 58a and the front recess 58b.

The front recess 58b is inclined not along the top recess 58a. The front recess 58b is inclined in the minor direction of the housing 52 of the connector 50, which is approximately perpendicular to the longitudinal direction of the housing 52 of the connector 50. The corner recess 58c is rounded, and located at a longitudinal end of the top recess 58a on the top face 56.

As shown in FIGS. 12 and 13, the wiring board 40 having the connector 50 is disposed on the bottom face 32 of the second casing 30 so as to seal the opening 31. In that state, the front recess 58b and the case recess 34a of the second casing 30 are connected to each other in a line without a clearance therebetween. Thus, the recess 58 of the connector 50 and the case recess 34a of the second casing 30 are connected to each other so as to define a rectangular recess.

As shown in FIG. 14, the projection 59 corresponding to the connector recess 34b of the second casing 30 is arranged on the bottom face 55 of the main body 54 of the connector 50. The third sealing 63 is disposed between the projection 59 and the connector recess 34b. As shown in FIG. 5, the projection 59 having an approximately U-shape is arranged on a back side of the recess 58 through the main body 54.

As shown in FIGS. 15 and 16, the wiring board 40 having the connector 50 is located on the bottom face 22 of the first casing 20 so as to seal the opening 21. In that state, the projection 59 and the case projection 27a of the first casing 20 are connected to each other in a line without a clearance therebetween. Thus, the projection 59 of the connector 50 and the case projection 27a of the first casing 20 are connected to each other so as to define a rectangular projection.

The sealing member 60 having the first sealing 61, the second sealing 62 and the third sealing 63 is made of a material having a sealing property such that the inner space 11 of the case 10 can be a waterproof space. For example, an adhesive having an adhesion property can be used as the sealing member 60. The first casing 20 and the second casing 30 are sealed by the adhesive when the adhesive is hardened. The first casing 20 and the housing 52 of the connector 50 are sealed by the adhesive when the adhesive is hardened. The second casing 30 and the housing 52 of the connector 50 are sealed by the adhesive when the adhesive is hardened.

Further, a material having a repulsive property or an elasticity can be used as the sealing member 60 even if the adhesion property of the material is low. The material having the repulsive property has a sealing effect by filling a clearance due to a repulsive force. Furthermore, a material having both of the adhesion property and the repulsive property can be used. For example, a moisture-curing type silicon bonding is used as the sealing member 60.

Figure 17A:
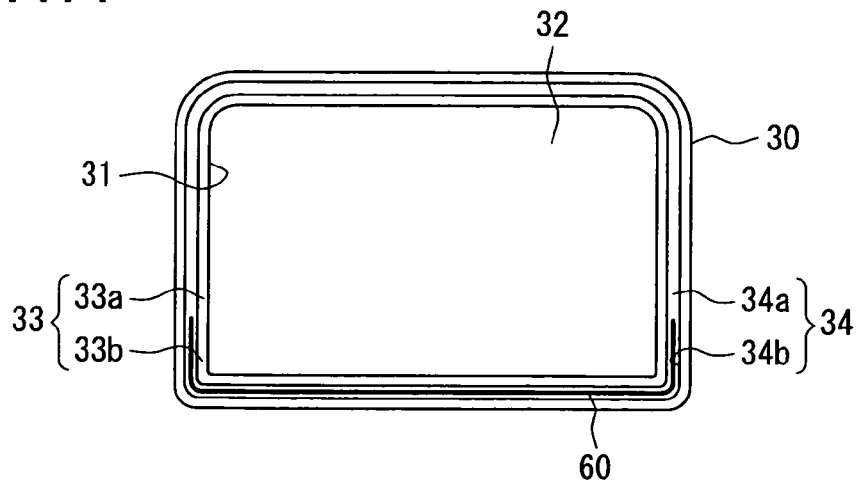
FIG. 17A is a schematic plan view showing the sealing member on the second casing.
Figure 17B:
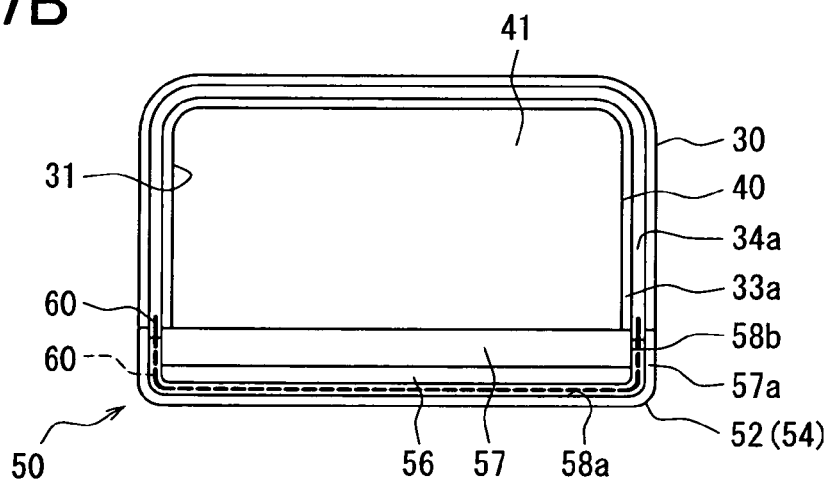
FIG. 17B is a schematic plan view showing the wiring board having the connector on the second casing.
Figure 17C:
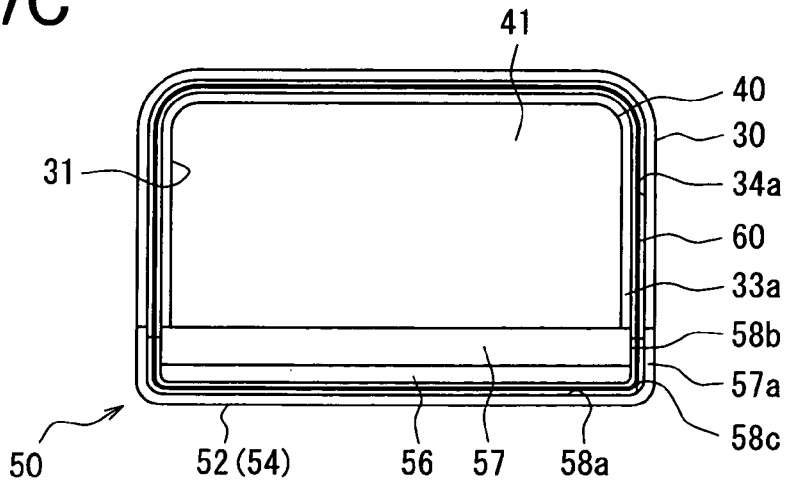
FIG. 17C is a schematic plan view showing the sealing member on the second casing and the connector.

A method of assembling the electronic control unit 100 will be described with reference to FIGS. 17A, 17B and 17C. FIG. 17A is a schematic plan view showing the sealing member 60 applied on a part of the second casing 30. FIG. 17B is a schematic plan view showing the wiring board 40 having the connector 50 arranged on the second casing 30. FIG. 17C is a schematic plan view showing the sealing member 60 applied on the second casing 30 and the connector 50. A dashed line of the FIG. 17B corresponds to the third sealing 63 of the sealing member 60.

As shown in FIG. 17A, the sealing member 60 is applied into the connector recess 34b arranged in the connector wall 33b of the wall part 33 of the second casing 30. The wall part 33 is constructed with the case wall 33a and the connector wall 33b. The recess 34 having the rectangular ring shape is constructed with the case recess 34a and the connector recess 34b.

As shown in FIG. 17B, the wiring board 40 having the connector 50 is located on the second casing 30. Specifically, the projection 59 of the housing 52 of the connector 50 is inserted into the connector recess 34b of the second housing 30 so as to be contact with the sealing member 60. The wiring board 40 is located such that a back face 42 of the wiring board 40 opposes to the bottom face 32 of the second casing 30 and seals the opening 31 of the second casing 30.

In this state, the third sealing 63 is located between the connector recess 34b of the second casing 30 and the projection 59 of the housing 52 of the connector 50. Further, the recess 58 of the housing 52 of the connector 50 is connected to the case recess 34a of the second casing 30. The sealing member 60 is applied into an end of the case recess 34a adjacent to the connector recess 34b so as to prevent a shortage of the sealing member 60 at the trifurcate structure between the sealings 61, 62, 63.

As shown in FIG. 17C, the sealing member 60 is applied into the recess 58 of the housing 52 of the connector 50 and the case recess 34a of the second casing 30. The recess 58 is constructed with the top recess 58a, the front recess 58b and the corner recess 58c. At this time, the recess 58 and the case recess 34a are connected to each other, and both of the corner recess 58c of the recess 58 and the corner of the case recess 34a are rounded. Therefore, the sealing member 60 can be applied in the recess 58 and the case recess 34a at the same time.

The opening 31 of the second casing 30 is covered with the first casing 20. The first casing 20 is located on the second casing 30 such that the wiring board 40 is disposed in the inner space 11. At this time, the case projection 27a on the inner surface of the first casing 20 is inserted into the case recess 34a of the second casing 30 so as to be contact with the sealing member 60. The connector projection 27b is inserted into the recess 58 of the connector 50 so as to be contact with the sealing member 60. The assembling of the electronic control unit 100 is finished by being fastened with a screw, for example.

In this assembled state, the case projection 27a protruding from the wall part 23 of the first casing 20 opposes to the case recess 34a recessed from the wall part 33 of the second casing 30. A part of the case projection 27a is buried in the first sealing 61 arranged in the case recess 34a.

Further, the connector projection 27b protruding from the opening edge 26, that is the flat part 24 and the inclined part 25, of the first casing 20 opposes to the recess 58 recessed from the housing 52 of the connector 50. A part of the connector projection 27b is buried in the second sealing 62 arranged in the recess 58.

Furthermore, the projection 59 protruding from the housing 52 of the connector 50 opposes to the connector recess 34b recessed from the connector wall 33b. A part of the projection 59 is buried in the third sealing 63 arranged in the connector recess 34b. Thus, the inner space 11 of the case 10 can be airtightly sealed.

Figure 18A:
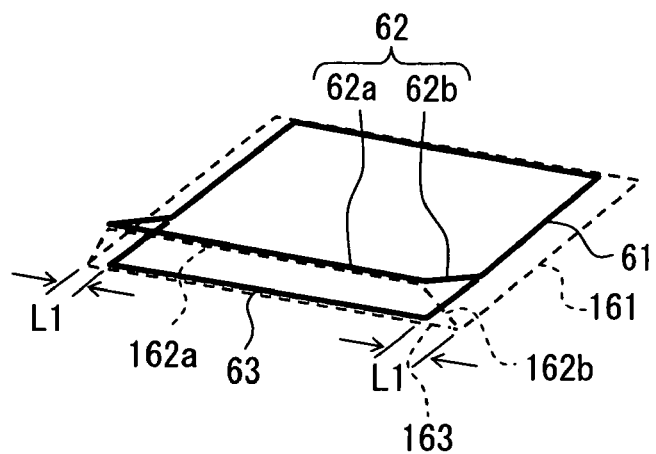
FIG. 18A is a schematic perspective view showing a comparison between the sealing member and a conventional sealing member.
Figure 18B:
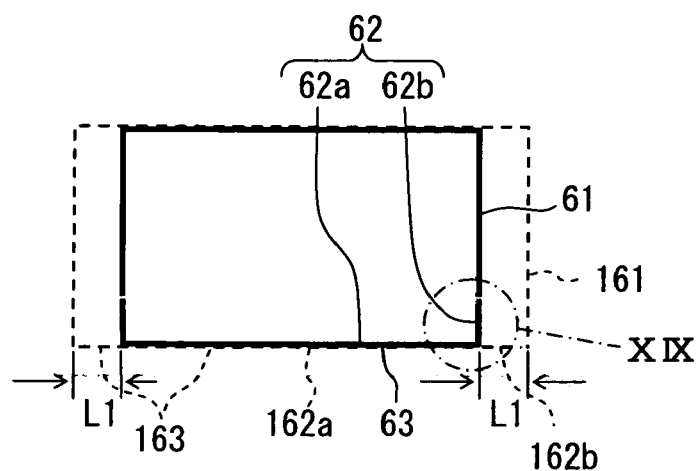
FIG. 18B is a schematic plan view showing a comparison between the sealing member and the conventional sealing member.

FIG. 18A is a schematic perspective view showing a comparison between the sealing member 60 constructed with the sealings 61, 62, 63 corresponding to a solid line and a conventional sealing member corresponding to a dashed line. FIG. 18B is a schematic plan view showing a comparison between the sealing member 60 and the conventional sealing member. In FIGS. 18A and 18B, the conventional sealing member is a comparison example having a first sealing 161, a second sealing 162 and a third sealing 163. The second sealing 162 is constructed with a parallel sealing 162a and an inclined sealing 162b.

Figure 19:
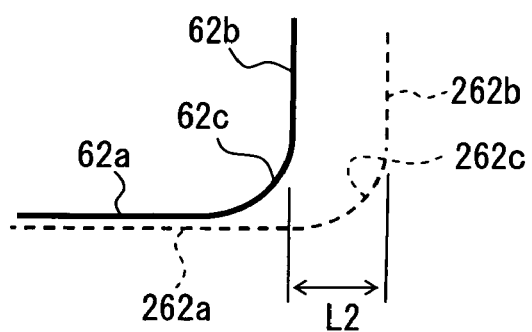
FIG. 19 is a schematic enlarged view of FIG. 18B.

FIG. 19 is an enlarged view of a longitudinal end of the second sealing 62 of FIG. 18B. A dashed line of FIG. 19 is a comparison example having a parallel sealing 262a, an inclined sealing 262b and a corner sealing 262c. The corner sealing 262c is a part of the inclined sealing 262b.

As shown in FIG. 7, the inclined part 25 extends in a direction approximately perpendicular to a longitudinal direction of the flat part 24. The inclined part 25 extends in a direction approximately perpendicular to the longitudinal direction of the housing 52 of the connector 50. That is, the inclined part 25 extends from a longitudinal end of the flat part 24 toward the connection part 23b of the wall part 23. That is, the opening edge 26 constructed with the flat part 24 and the inclined part 25 has an approximately U-shape. The connector projection 27b disposed along the opening edge 26 also has the U-shape.

Further, as shown in FIG. 9, the front face 57 of the connector 50 has the taper shape. The height of the front face 57 from the top face 41 of the wiring board 40 becomes higher toward the fitting 53 of the connector 50. The front recess 58b extends in a direction approximately perpendicular to the longitudinal direction of the top recess 58a. That is, the front recess 58b extends from a longitudinal end of the top recess 58a in the minor direction of the housing 52 of the connector 50. That is, the recess 58 constructed with the top recess 58a and the front recess 58b has an approximately U-shape.

As shown in FIG. 18A, the second sealing 62 is constructed with a parallel sealing 62a and an inclined sealing 62b. The parallel sealing 62a is disposed between the connector projection 27b of the flat part 24 and the top recess 58a of the connector 50. The inclined sealing 62b is disposed between the connector projection 27b of the inclined part 25 and the front recess 58b of the connector 50. The parallel sealing 62a is approximately parallel to the top face 41 of the wiring board 40. The inclined sealing 62b extends from an end of the parallel sealing 62a in a direction approximately perpendicular to the longitudinal direction of the parallel sealing 62a.

The inclined sealing 62b has a first end connected to the first sealing 61, and a second end connected to the parallel sealing 62a. The first end is away toward the inner space 11 from the second end in a direction approximately perpendicular to the longitudinal direction of the parallel sealing 62a. Thus, the second sealing 62 has an approximately U-shape.

The inclined sealing 62b is inclined in a direction extending from the parallel sealing 62a to the first sealing 61, which corresponds to the minor direction of the housing 52 of the connector 50. That is, the inclined sealing 62b extends in a direction approximately perpendicular to a longitudinal direction of the parallel sealing 62a. The inclined sealing 62b extends not in the longitudinal direction of the parallel sealing 62a. Thereby, as shown in FIGS. 18A and 18B, a dimension of the inclined sealing 62b is shorter than a dimension of the inclined sealing 162b in the longitudinal direction of the housing 52 of the connector 50.

Thus, a longitudinal dimension of the second sealing 62 becomes short by a length of L1×2, compared with the comparison example. The longitudinal dimension of the second sealing 62 becomes approximately equal to a dimension of the parallel sealing 62a, which corresponds to a dimension of the housing 52 needed for holding the terminals 51. Therefore, the size of the connector 50 can be reduced in the longitudinal direction of the housing 52 of the connector 50. Accordingly, the size of the electronic control unit 100 can be reduced in the longitudinal direction of the housing 52 of the connector 50.

Further, the sealing member 60 can be prevented from being broken when the first casing 20 and the second casing 30 are assembled, because shear stress generated to the sealing member 60 is reduced due to the inclined sealing 62b.

Further, the recess 34 of the second casing 30 has four rounded corners. Furthermore, two of the corner recesses 58c of the housing 52 of the connector 50 are rounded. Therefore, when the sealing member 60 is applied into a rectangular ring-shaped recess constructed with the case recess 34a and the recess 58 shown in FIG. 17C at the same time, a speed for applying the sealing member 60 can be made constant. The speed for applying the sealing member 60 needs not to be changed or controlled.

Therefore, a variation of an amount of the sealing member 60 in the recess 34, 58 can be reduced, so that a productivity of the electronic control unit 100 can be improved. Especially, the sealing member 60 can be retained at a predetermined position, because the sealing member 60 is filled into the recess 34, 58 having a concave shape.

Two of the corner recesses 58c are located on the top face 56, and configured to be the longitudinal end of the top recess 58a. That is, as shown in a solid line of FIG. 19, a corner sealing 62c is configured to be an end of the parallel sealing 62a. The corner sealing 62c is included in the parallel sealing 62a, and the inclined sealing 62b has a linear shape.

In contrast, as shown in the dashed line of FIG. 19 corresponding to the comparison example, the corner sealing 262c is included in the inclined sealing 262b. A dimension of the parallel sealing 262a is longer than a dimension of the parallel sealing 62a by a length of L2 in the longitudinal direction of the housing 52 of the connector 50. Therefore, the size of the connector 50 can be reduced in the longitudinal direction, compared with the comparison example in which the corner sealing 262c is included in the inclined sealing 262b. Accordingly, the size of the electronic control unit 100 can be reduced in the longitudinal direction of the housing 52 of the connector 50.

All of the corner sealing 62c are included in the parallel sealing 62a in this embodiment. However, at least a part of the corner sealing 62c connecting the parallel sealing 62a and the inclined sealing 62b may be included the parallel sealing 62a. In this case, the size of the connector 50 can be reduced in the longitudinal direction of the housing 52 of the connector 50, compared with a structure in which all of the corner sealing 62c is included in the inclined sealing 62b.

The front face 57 opposing to the inner space 11 has the taper shape. As shown in FIG. 5, the end of the terminal 51 extends toward the inner space 11 from the taper shape of the front face 57. However, at least the longitudinal end 57a, on which the front recess 58b is arranged, may have the taper shape.

Figure 20:
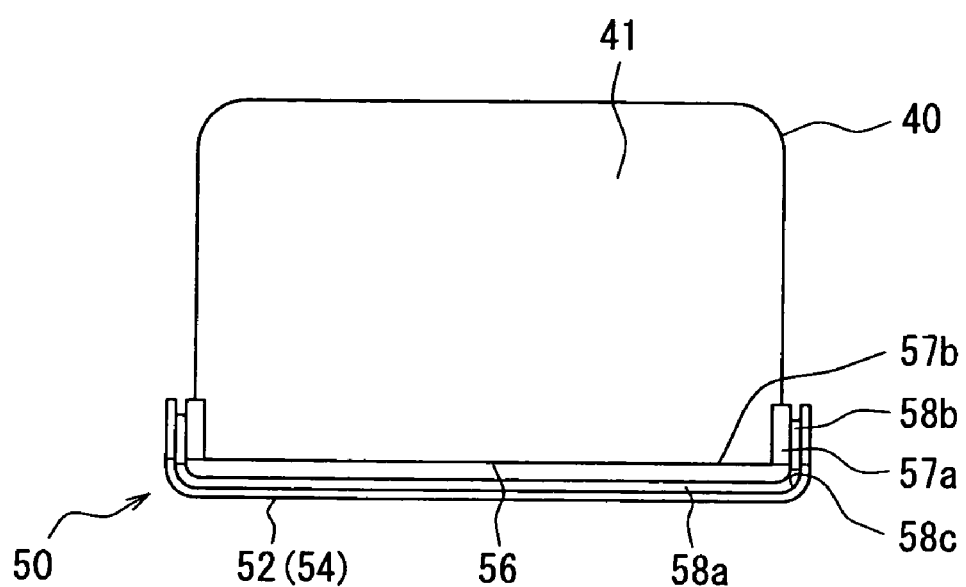
FIG. 20 is a plan view showing a modified front face of the connector.

For example, as shown in FIG. 20, only the longitudinal end 57a has the taper shape, while a center part 57b of the front face 57 located between the longitudinal ends 57a extends perpendicularly from the top face 56 toward the top face 41 of the wiring board 40. In this case, an area allowable for mounting the electronic parts on the top face 41 of the wiring board 40 can be increased. Further, the size of the wiring board 40 can be reduced if the area allowable for mounting the electronic parts is maintained.

Second Embodiment

Figure 21:
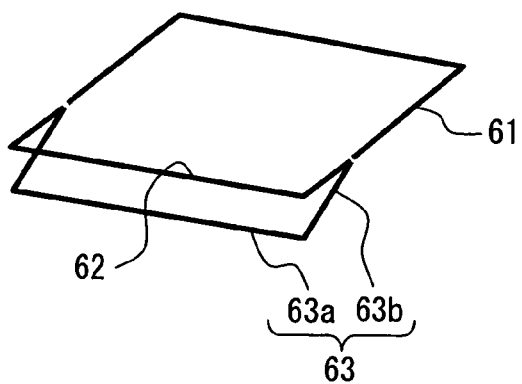
FIG. 21 is a schematic perspective view showing a sealing member of an electronic control unit according to a second embodiment.
Figure 22:
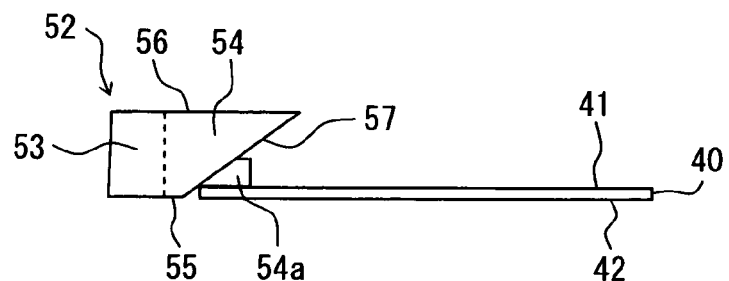
FIG. 22 is a schematic side view showing a wiring board and a connector of the electronic control unit according to the second embodiment.

A second embodiment will be described with reference to FIGS. 21 and 22. FIG. 21 is a schematic perspective view showing a sealing member 60 of an electronic control unit 100 according to the second embodiment, and corresponds to FIG. 18A. FIG. 22 is a side view showing a wiring board 40 and a connector 50 of the electronic control unit 100 according to the second embodiment, and corresponds to FIG. 9.

A part of a construction of an electronic control unit 100 of the second embodiment is similar to that of the first embodiment. Detailed description relating to the similar part is omitted, and different parts are described below.

In the first embodiment, the second sealing 62 has the inclined sealing 62b extending from the end of the parallel sealing 62a toward the first sealing 61 in the minor direction of the housing 52 of the connector 50. In contrast, in the second embodiment, as shown in FIG. 21, a third sealing 63 has an inclined sealing 63b extending from an end of a parallel sealing 63a toward the first sealing 61 in the minor direction of the housing 52 of the connector 50. A second sealing 62 of the second embodiment is located on the same plane as the first sealing 61.

For example, the connector 50 has a housing 52 shown in FIG. 22. The housing 52 has a front face 57 opposing to the inner space 11, and the front face 57 connects a bottom face 55 and a top face 56. The front face 57 has a taper shape having a height defined from the top face 41 of the wiring board 40, which becomes higher as going away from a fitting 53. The connector 50 has a fixed part 54a, which is a part of a main body 54. The fixed part 54a protrudes from the front face 57, and is arranged on the top face 41 of the wiring board 40.

A front projection defining the inclined sealing 63b is located on the longitudinal end 57a of the front face 57 having the taper shape. The front projection is integrally connected to an end of a bottom projection defining the parallel sealing 63a arranged on the bottom face 55. A projection 59 constructed with the front projection and the bottom projection has an approximately U-shape.

Further, a recess having an approximately U-shape is arranged on the top face 56. The first casing 20 has a shallow box shape similar to the second casing 30 of the first embodiment. A ring-shaped projection 27 is arranged on a periphery of the first casing 20. The second casing 30 has a dustpan shape similar to the first casing 20 of the first embodiment. A ring-shaped recess 34 is arranged on a periphery of the second casing 30.

The electronic control unit 100 of the second embodiment can have the same effect as the first embodiment.

Further, when all of the front face 57 has the taper shape, a predetermined length of the terminal 51 can secure to be exposed from the front face 57. A distance from a fitting-side end of the wiring board 40 to a position at which the terminal 51 is mounted to the wiring board 40 can be reduced, when FIG. 22 is compared with FIG. 9 of the first embodiment.

In this case, an area allowable for mounting the electronic parts can be increased on the top face 41 of the wiring board 40. Further, the size of the wiring board 40 can be reduced when the area allowable for mounting the electronic parts is maintained. Furthermore, the modified structure shown in FIG. 20 can also be adapted to the second embodiment.

Third Embodiment

Figure 23:
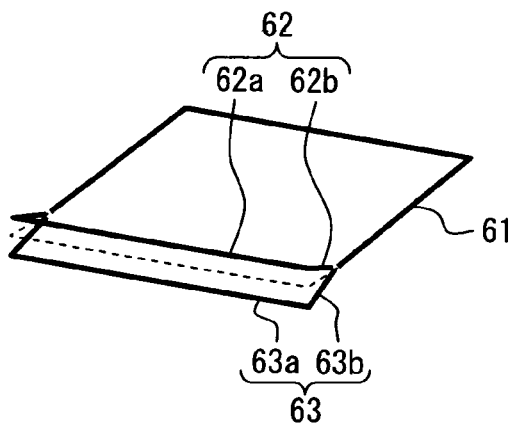
FIG. 23 is a schematic perspective view showing a sealing member of an electronic control unit according to a third embodiment.
Figure 24:
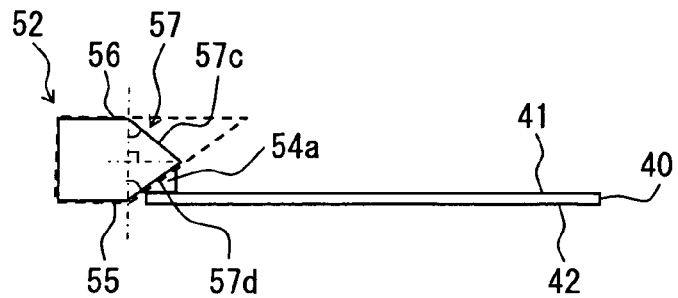
FIG. 24 is a schematic side view showing a wiring board and a connector of the electronic control unit according to the third embodiment.

A third embodiment will be described with reference to FIGS. 23 and 24. FIG. 23 is a schematic perspective view showing a sealing member 60 of an electronic control unit 100 according to the third embodiment, and corresponds to FIG. 18A. FIG. 24 is a side view showing a wiring board 40 and a connector 50 of the electronic control unit 100 according to the third embodiment, and corresponds to FIG. 9.

A part of a construction of an electronic control unit 100 of the third embodiment is similar to that of the first embodiment or the second embodiment. Detailed description relating to the similar part is omitted, and different parts are described below.

In the first embodiment, the second sealing 62 has the inclined sealing 62b in addition to the parallel sealing 62a. In the second embodiment, the third sealing 63 has the inclined sealing 63b in addition to the parallel sealing 63a. In the third embodiment, as shown in FIG. 23, the second sealing 62 has the inclined sealing 62b in addition to the parallel sealing 62a, and the third sealing 63 has the inclined sealing 63b in addition to the parallel sealing 63a. That is, each of the second sealing 62 and the third sealing 63 has the inclined sealing 62b, 63b extending from the end of the parallel sealing 62a, 63a toward the first sealing 61 in the minor direction of the housing 52 of the connector 50.

For example, the connector 50 has a housing 52 shown in FIG. 24. The housing 52 has a front face 57 opposing to the inner space 11. The front face 57 connects a bottom face 55 and a top face 56, and is constructed with a first front face 57c and a second front face 57d. The first front face 57c and the second front face 57d are approximately symmetrical to each other relative to a center line between the top face 56 and the bottom face 55. That is, each of the second sealing 62 and the third sealing 63 is connected to the first sealing 61 at a center position between the bottom face 55 and the top face 56.

A height of the first front face 57c defined from the top face 41 of the wiring board 40 becomes higher toward the fitting 53. A height of the second front face 57d defined from the top face 41 of the wiring board 40 becomes higher as going away from the fitting 53. Further, the connector 50 has a fixed part 54a, which is a part of the main body 54. The fixed part 54a protrudes from the front face 57, and is arranged on the top face 41 of the wiring board 40.

A front recess defining the inclined sealing 62b is located on the longitudinal end of the first front face 57c having the taper shape. The front recess is integrally connected to an end of a top recess defining the parallel sealing 62a arranged on the top face 56. The recess 58 constructed with the front recess and the top recess has an approximately U-shape.

A front projection defining the inclined sealing 63b is located on the longitudinal end of the second front face 57d having the taper shape. The front projection is integrally connected to an end of a bottom projection defining the parallel sealing 63a arranged on the bottom face 55. The projection 59 constructed with the front projection and the bottom projection has an approximately U-shape.

Further, each of the first casing 20 and the second casing 30 has a dustpan shape similar to the first casing 20 of the first embodiment. A ring-shaped projection 27 is arranged on a periphery of the first casing 20, and a ring-shaped recess 34 is arranged on a periphery of the second casing 30.

The electronic control unit 100 of the third embodiment can have the same effect as the first embodiment.

Each of the second sealing 62 and the third sealing 63 is connected to the first sealing 61 at a center position between the bottom face 55 and the top face 56. Therefore, the dimension of the front face 57 can be reduced in the minor direction of the housing 52 of the connector 50, compared with the second embodiment defined by a dashed line of FIG. 24. Accordingly, a dimension of the housing 52 of the connector 50 can be reduced in the minor direction.

Each of the second sealing 62 and the third sealing 63 is connected to the first sealing 61 at a center position between the bottom face 55 and the top face 56. However, the position connecting the sealings 61, 62, 63 is not limited to the center position between the bottom face 55 and the top face 56. When the front face 57 has the first front face 57c and the second front face 57d, the length of the front face 57 can be reduced in the minor direction. Accordingly, the length of the housing 52 of the connector 50 can be reduced in the minor direction.

However, when each of the second sealing 62 and the third sealing 63 is connected to the first sealing 61 at the center position between the bottom face 55 and the top face 56, the length of the front face 57 can be half in the minor direction, compared with that of the first embodiment or the second embodiment.

The construction of the electronic control unit 100 may be modified without departing from the scope of the present disclosure.

The projection 27 is arranged on the first casing 20. The recess 34 is arranged on the second casing 30. The recess 58 is arranged on the connector 50 to oppose the first casing 20. The projection 59 is arranged on the connector 50 to oppose the second casing 30. However, a structure of the connection between the casings 20, 30 and the connector 50 is not limited to the above example.

For example, a recess may be arranged on the first casing 20 in place of the projection 27. A projection may be arranged on the second casing 30 in place of the recess 34. A projection may be arranged on the connector 50 to oppose the first casing 20 in place of the recess 58. A recess may be arranged on the connector 50 to oppose the second casing 30 in place of the projection 59.

Further, the recess 34, 58 or the projection 27, 59 may not be arranged on the casings 20, 30 and the connector 50. However, a leakage path can be made long due to the recess 34, 58 and the projection 27, 59. Furthermore, the sealing member 60 can be applied into the recess 34, 58 having the rectangular ring shape at the same time. However, a shape into which the sealing member 60 is applied is not limited to the recess 34, 58.

The inclined sealing 62b extends from an end of the parallel sealing 62a in a direction having an angle of about 90° between the parallel sealing 62a and the inclined sealing 62b. However, the angle is not limited to 90°. The inclined sealing 62b has a first end connected to the first sealing 61, and a second end connected to the parallel sealing 62a. The first end is away toward the inner space 11 from the second end in the minor direction of housing 52 of the connector 50.

For example, the angle may be about 120°. The angle may be equal to or larger than 90°, and may be smaller than 180°. When the angle is smaller than 90°, the sealing member 60 may be difficult to be applied to the recess 34, 58 at the same time. However, when the angle is smaller in the above-described range between 90° and 180°, the size of the connector 50 can be smaller in the longitudinal direction of the housing 52 of the connector 50. The electronic control unit 100 can be smaller in the longitudinal direction of the housing 52 of the connector 50.

Each of the first sealing 61, the second sealing 62 and the third sealing 63 has two rounded corners. However, at least one of the sealings 61, 62, 63 may not have the rounded corner.

Such changes and modifications are to be understood as being within the scope of the present invention as defined by the appended claims.

What is claimed is:

1. An electronic device comprising:
    a wiring board having electronic parts thereon;
    a connector corresponding to the electronic parts and including
        a housing made of an insulation material, and
        a plurality of terminals for electrically connecting the wiring board and an external connector, wherein the plurality of terminals is held by the housing and arranged in a longitudinal direction of the housing;
    a case having an inner space constructed with
        a first casing located to oppose the connector, and
        a second casing mounted to the first casing in a thickness direction of the wiring board, wherein the case has an opening for exposing a part of the connector and accommodates other part of the connector and the wiring board in the inner space; and
    a sealing member including
        a first sealing disposed between a periphery of the first casing and a periphery of the second casing,
        a second sealing disposed between a periphery of the first casing and the housing of the connector, and
        a third sealing disposed between a periphery of the second casing and the housing of the connector, wherein the first sealing, the second sealing, and the third sealing are connected to each other such that the inner space of the case is a waterproof space,
    at least one of the second sealing and the third sealing includes
        a parallel part approximately parallel to a surface of the wiring board, the parallel part being separated from the first sealing in a thickness direction of the wiring board, and
        an inclined part connecting the parallel part and the first sealing, the inclined part having a first end connected to the first sealing and a second end connected to the parallel part, wherein
    the inclined part extends from the second end to the first end in a direction approximately perpendicular to the longitudinal direction of the housing of the connector.

2. The electronic device according to claim 1, wherein
    the wiring board has an approximately rectangular shape, and
    each of the second sealing and the third sealing is connected to the first sealing so as to define an approximately rectangular ring shape having four rounded corners.

3. The electronic device according to claim 2, wherein a part of the rounded corner is arranged on the parallel part.

4. The electronic device according to claim 1, wherein only the second sealing has the parallel part and the inclined part.

5. The electronic device according to claim 1, wherein only the third sealing has the parallel part and the inclined part.

6. The electronic device according to claim 1, wherein both of the second sealing and the third sealing have the parallel part and the inclined part.

7. The electronic device according to claim 6, wherein each of the second sealing and the third sealing is connected to the first sealing at a center position between the parallel part of the second sealing and the parallel part of the third sealing in the thickness direction of the wiring board.

8. An electronic device comprising:
    a wiring board having electronic parts thereon;
    a connector corresponding to the electronic parts and including
        a housing made of an insulation material, and
        a plurality of terminals for electrically connecting the wiring board and an external connector, wherein the plurality of terminals is held by the housing and arranged in a longitudinal direction of the housing;
    a case having an inner space constructed with
        a first casing located to oppose the connector, and
        a second casing mounted to the first casing in a thickness direction of the wiring board, wherein the case has an opening for exposing a part of the connector and accommodates other part of the connector and the wiring board in the inner space; and
    a sealing member including
        a first sealing disposed between a periphery of the first casing and a periphery of the second casing,
        a second sealing disposed between a periphery of the first casing and the housing of the connector, and
        a third sealing disposed between a periphery of the second casing and the housing of the connector, wherein the first sealing, the second sealing, and the third sealing are connected to each other such that the inner space of the case is a waterproof space,
    at least one of the second sealing and the third sealing includes
        a parallel part approximately parallel to a surface of the wiring board, the parallel part being separated from the first sealing in a thickness direction of the wiring board, and
        an inclined part connecting the parallel part and the first sealing, wherein the parallel part and the inclined part have an angle equal to or larger than 90° and smaller than 180° between the parallel part and the inclined part.

* * * * *